(12) United States Patent
Chan et al.

(10) Patent No.: US 6,339,002 B1
(45) Date of Patent: Jan. 15, 2002

(54) METHOD UTILIZING CMP TO FABRICATE DOUBLE GATE MOSFETS WITH CONDUCTIVE SIDEWALL CONTACTS

(75) Inventors: Kevin K. Chan, Staten Island; Erin C. Jones, Tuckahoe; Paul M. Solomon, Yorktown Heights, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/501,226

(22) Filed: Feb. 10, 2000

Related U.S. Application Data
(60) Provisional application No. 60/119,418, filed on Feb. 10, 1999.

(51) Int. Cl.[7] .............................................. H01L 21/336
(52) U.S. Cl. ...................................... 438/283; 438/299
(58) Field of Search .............................. 438/197, 257, 438/259, 261, 262, 263, 264, 283, 294, 296, 299, 304; 257/288, 327

(56) References Cited

U.S. PATENT DOCUMENTS
5,858,821 A * 1/1999 Dennison et al.

FOREIGN PATENT DOCUMENTS
EP        0 991 114 A2  *  4/2000

* cited by examiner

Primary Examiner—Charles Bowers
Assistant Examiner—Evan Pert
(74) Attorney, Agent, or Firm—McGinn & Gibb, PLLC

(57) ABSTRACT

A method of forming a double gate metal-oxide-semiconductor field effect transistor (MOSFET). The method includes planarizing a backgate mesa stack of a backgate using chemical mechanical polishing (CMP) to isolate the backgate mesa. A topgate mesa stack is formed and patterned. The backgate is trimmed using the topgate as a mask to transfer a topgate pattern to the backgate. Then, the trimmed backgate is isolated. In one particular embodiment, CMP is used to isolate and planarize the trimmed backgate.

22 Claims, 10 Drawing Sheets

METHOD UTILIZING CMP TO FABRICATE DOUBLE GATE MOSFETS WITH CONDUCTIVE SIDEWALL CONTACTS

CROSS-REFERENCE TO RELATED APPLICATION

The present application is further related to Provisional Patent Application No. 60/119,418, filed Feb. 10, 1999, to Jones et al., entitled "METHOD FOR MAKING SINGLE AND DOUBLE GATE FIELD EFFECT TRANSISTORS USING CONDUCTING SIDEWALL CONTACTS USING CHEMICAL MECHANICAL POLISHING", having IBM Docket No. YO999-073, assigned to the present assignee, and incorporated herin by reference.

The present application is related to a new U.S. patent application, filed concurrently, to Jones et al., entitled "TWO STEP MOSFET GATE FORMATION FOR HIGH-DENSITY DEVICES", having IBM Docket No. YOR-9-2000-0018, assigned to the present assignee, and incorporated herein by reference.

The U.S. Government has a paid-up license in this invention and the right in limited circumstances to require the patent owner to license others on reasonable terms as provided for by the terms of N66001-97-18908 awarded by the Defense Advanced Research Projects Agency (DARPA)

BACKGROUND OF THE INVENTION

1. Field of the Invention

The present invention generally relates to double gate metal-oxide-semiconductor field effect transistors (MOSFETs) and, more particularly, to an improved method for forming and isolating a double gate backgate MOSFET device.

2. Description of the Related Art

Double gate metal-oxide-semiconductor field effect transistor (MOSFET) designs have been studied as one way to extend traditional single-gate MOSFET scaling into the next few generations of miniaturization. Where traditional single gate MOSFETs need precipitously thinned gate oxides and precisely controlled dopant distributions at levels approaching solid solubility in order to control device short channel effects and produce good on-to-off current ratios (Y. Taur and S. Novak, 1997 IEDM Tech. Digest, IEEE, Piscataway, N.J., USA, p. 215; incorporated herein by reference), devices with a backgate are expected to deliver improved device characteristics, improved short channel effects and increased drive current, at the same and higher gate oxide thickness, with silicon channels with reduced doping (H. S. Wong, D. J. Frank, and P. M. Solomon, 1998 IEDM Tech. Digest, IEEE, Piscataway, N.J., USA, p. 407; incorporated herein by reference). Recent simulations show that with a backgate, device characteristics are most dependent on channel thickness (Wong et al., supra). Other parameters of importance to the device behavior are the alignment of the top and bottom gates and the overlap of the two gates and the source/drain area.

A number of double gate devices have been proposed and fabricated, but a truly manufacturable process has not been identified. A double gate device fabricated on standard silicon wafers by growing epitaxial silicon through placeholder gates which are replaced later with polysilicon has produced the best top to bottom gate alignment.

However, the epitaxially grown channel is very difficult and slow to grow, and does not have top electric quality (H. S. Wong, K. K. Chan, Y. Taur, 1998 IEDM Tech. Digest, IEEE, Piscataway, N.J., USA, p. 427; incorporated herein by reference). Defining and planarizing backgate structures and then bonding the backgate structures to a silicon wafer has been attempted. However, aligning the top gates to bottom gates hidden under a silicon channel has not yet produced devices with adequate overlay (I. A. Yang, A. Lochtefeld, and D. A. Antoniadis, Proc. 1996 IEEE Int. SOI Conf, IEEE, Piscataway, N.J., USA, p. 106; incorporated herein by reference).

A previous patent by Solomon and Wong, 5,773,331, solves many of these problems. As illustrated in FIG. 1, the prior art of Solomon and Wong uses a starting silicon wafer 10 having blanket layers of buried oxide 12, backgate material 14, backgate dielectric 16 and crystalline silicon channel 18. The backgate material 14 may be polysilicon or metal. The wafers can be made by bonding and etch back techniques, by using either high dose implantation and subsequent layer splitting, or by double SIMOX.

The Solomon and Wong device is made by patterning the top half of the device in a way similar to a conventional MOSFET, and then using the top half of the device as an etch mask for the self-aligned patterning of the backgate. This produces a smaller total device area than an epitaxial-Si based device which must include an extra open area for the Si seed. In addition, using the top half of the device as an etch mask allows better top-to- bottom gate overlay than pre-patterned backgate approaches and further allows the use of metallic backgate materials.

The process of Solomon and Wong has limitations. One limitation is the dependence on sidewall isolation. The Solomon and Wong device has very severe topography, which leads to debris from each reactive ion etching step to build up both outside the topgate and bottom gate mesa patterns as well as inside the source/drain well areas. Extensive simulations of this device have shown that extremely precise alignment of the different masks used to make the top and bottom gate mesas and the source/drain wells is necessary to avoid shorting of the top gate to the sidewall source/drain. It is also necessary to increase the overlap of the top and bottom gates in the plane of the gate contacts to reduce the likelihood of shorting.

Further, in the Solomon and Wong design, the source and drain are very likely to be connected without the addition of an additional mask. The alignment and resolution requirements of the first level of metal is also very critical in this design, since the metal has to separately contact the narrow and closely spaced sidewall source/drain silicide contacts.

An alternative proposed by Solomon and Wong is to use chemical mechanical polishing (CMP) to separate source from drain. However, such a proposed method is difficult to implement because of the lack of a common reference level for the CMP at this step.

SUMMARY OF THE INVENTION

In view of the foregoing and other problems, disadvantages, and drawbacks of the conventional methods for producing MOSFET backgate devices, the present invention has been devised, and it is an object of the present invention to provide a method for using chemical mechanical polishing (CMP) for isolation and planarization of the MOSFET backgate device.

The invention, in one form thereof, is a method of forming a backgate for a double gate metal-oxide-semiconductor field effect transistor (MOSFET). The method comprising the steps of supplying a bottom gate mesa stack, planarizing the bottom mesa stack using chemical mechanical polishing (CMP) to isolate the bottom gate mesa, forming a topgate mesa stack, patterning and isolating the topgate, trimming the backgate using the topgate as a mask to transfer a pattern to the bottom gate, and isolating the trimmed backgate. In one particular embodiment, the topgate used as a mask to trim the backgate includes using the isolated topgate or the topgate plus source/drain areas. In another embodiment, CMP is used to planarize the topgate mesa and then the edges of the topgate mesa are etched to form the active gate and wells in which the source and drain are formed.

Objects of the present invention are to reduce or eliminate the risk of source-to-drain shorts, reduce or eliminate the risk of gate to source/drain shorts, decrease the top and bottom gate overlap capacitance, increase the tolerance of the device layout to lithography overlay errors, and reduce the number of critical lithography levels. Further, this inventive method includes improved manufacturability of backgate MOSFET devices over conventional methods.

BRIEF DESCRIPTION OF THE DRAWINGS

The foregoing and other objects, aspects and advantages will be better understood from the following detailed description of a preferred embodiment(s) of the invention with reference to the drawings, in which:

FIG. 3(*a*) depicts the bottom mesa stack according to one embodiment of the present invention;

FIG. 3(*b*) depicts the bottom mesa stack of FIG. 3(*a*) with a deposited dielectric (oxide) layer; and FIG. 3(*c*) depicts an isolated backgate structure produced by planarization of the deposited dielectric layer of FIG. 3(*b*).

FIG. 4(*a*) illustrates a main cross section through the bottom gate mesa;

FIG. 4(*b*) illustrates a cross section through the gates; and

FIG. 4(*c*) illustrates a layout of a bottom gate mesa mask.

FIG. 5(*a*) illustrates a main cross section of the device;

FIG. 5(*b*) illustrates a cross section through the gates of the device; and

FIG. 5(*c*) illustrates a top view of the layout of a topgate mesa mask.

FIG. 6(*a*) illustrates a main cross section of the device;

FIG. 6(*b*) illustrates a cross section through the gates of the device of FIG. 6(*a*); and FIG. 6(*c*) illustrates a top view of the source/drain well definition mask.

FIG. 7(*a*) illustrates a main cross section of the device with a gate insulating spacer;

FIG. 7(*b*) illustrates a cross section through the gates of the device in FIG. 7(*a*); and FIG. 7(*c*) illustrates a top view of the layout of a no mask, self- aligned step according to the present invention.

FIG. 8(*a*) illustrates a main cross section of the device following silicidation, FIG. 8(*b*) illustrates a cross section through the gates of the device illustrated in FIG. 8(*a*) and FIG. 8(*c*) illustrates a top view of a contact hole mask level for the device of FIG. 8(*a*) and (*b*).

FIG. 9(*a*) illustrates a main cross section of the device with a backgate isolation spacer;

FIG. 9(*b*) illustrates a cross section through the gates of the device in FIG. 9(*a*); and FIG. 9(*c*) illustrates a top view of the layout of a maskless, self-aligned step according to the present invention.

FIG. 10(*a*) illustrates a main cross section of the device with a backgate with plug;

FIG. 10(*b*) illustrates a cross section through the gates of the device in FIG. 10(*a*); and FIG. 10(*c*) illustrates a top view of the layout of a maskless, self-aligned step according to the present invention.

FIG. 11(*a*) illustrates a main cross section of the device following metallization;

FIG. 11(*b*) illustrates a cross section through the gates of the device in FIG. 11(*a*); and FIG. 11(*c*) illustrates top view of a first level metal mask according to the present invention.

DETAILED DESCRIPTION OF PREFERRED EMBODIMENTS OF THE INVENTION

CMP is a common technique for planarization of MOSFET back end structures, such as multiple levels of metal separated by planarized dielectrics. CMP is becoming more commonly used for front end device isolation, in steps like recessed oxide fabrication. In the present invention, CMP is used after the bottom gate mesa etch and may be used after topgate mesa etch.

CMP after the bottom gate etch isolates the bottom gate and reduces the bottom gate's likelihood of shorting to other levels. CMP of the topgate mesa reduces the topgate's likelihood of shorting to other levels and allows for the creation of source/drain wells which can be filled with metal later in the process, forming self-aligned tungsten plugs.

Figure 1:
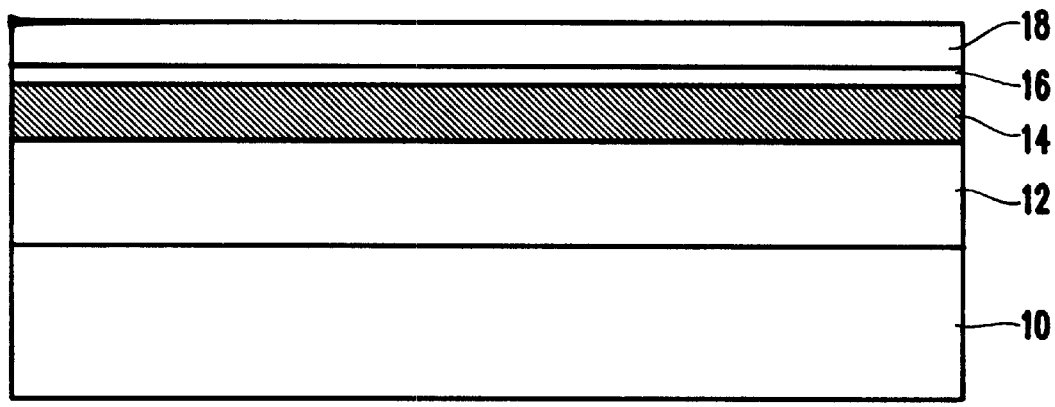
FIG. 1 is a schematic diagram of the prior art depicting a cross-section through various blanket layers of a prepared semiconductor substrate before the double gate MOSFET device fabrication.
Figure 2:
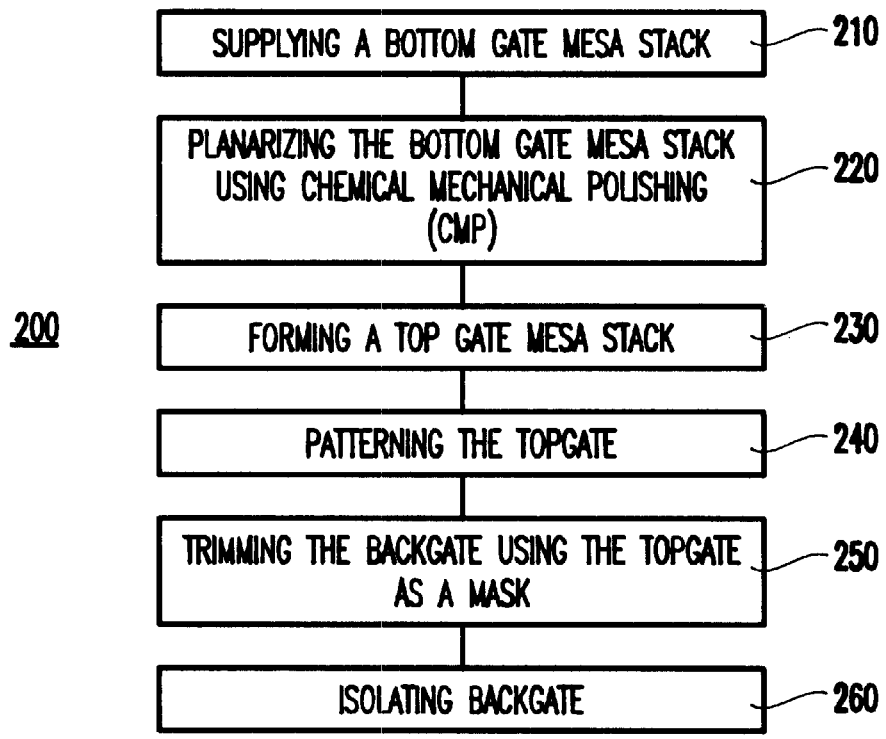
FIG. 2 is flow diagram illustrating one embodiment of the present invention.

Referring now to the drawings, FIG. 2 is a flow diagram of one method of forming a backgate (200) according to one embodiment of the present invention. A starting semiconductor substrate is supplied having a bottom gate stack of materials (210) including the layers (from top to bottom in FIG. 1) crystalline semiconductor 18 backgate dielectric 16, backgate conductor 14, buried oxide 12 and semiconductor substrate 10. The bottom gate stack is patterned and then planarized using chemical mechanical polishing (CMP) to isolate the bottom gate mesa (220). A topgate mesa stack is formed on the bottom gate (230). Subsequently, the topgate mesa stack is then patterned (240). It may perhaps then be isolated and perhaps the source/drain regions will be defined. The backgate is trimmed using the topgate, which may include the topgate before isolation, the isolated topgate, or the isolated topgate plus source and drain areas as a mask to transfer a pattern to the bottom gate (250). The backgate is then isolated by any conventional method (260). In one specific further embodiment, chemical mechanical polishing (CMP) is used to isolate the topgate mesa before the active topgate dimension is defined (230).

FIGS. 3–11 are exemplars of a double gate metal-oxide-semiconductor field effect transistor (MOSFET) produced using the various embodiments of the present invention.

Figure 3A:
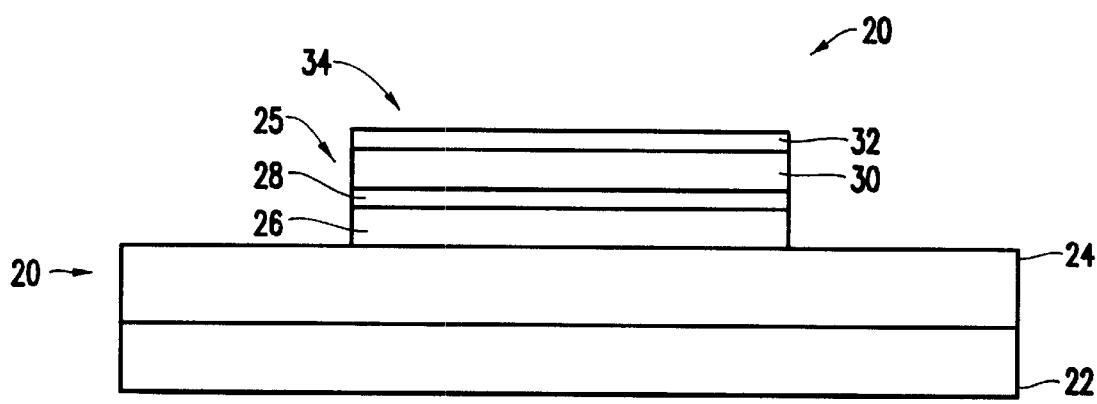
FIGS. 3(*a*)–3(*c*) illustrate creation and isolation of a bottom gate mesa which forms a portion of the backgate of the present invention.

Referring specifically to FIG. 3(a), MOSFET device 20 includes a CMP stopping layer 32 formed on the prepared silicon substrate 22 having a backgate with layers of backgate conductor material 26, backgate dielectric 28 and crystalline silicon 30 on top of a buried oxide 24. The bottom gate mesa 25 is formed by reactive ion etching, perhaps even by using the CMP stopping layer 32 as a hardmask. The backgate conductor 26 may be made of metal, polysilicon, or any material compatible with the processing and conductive enough to function in a device capacity.

Figure 3B:
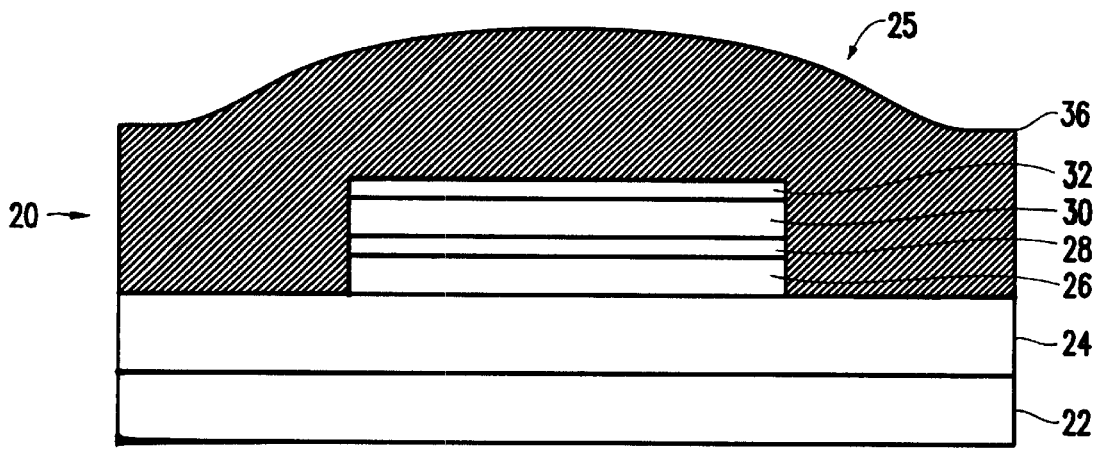
Figure 3C:
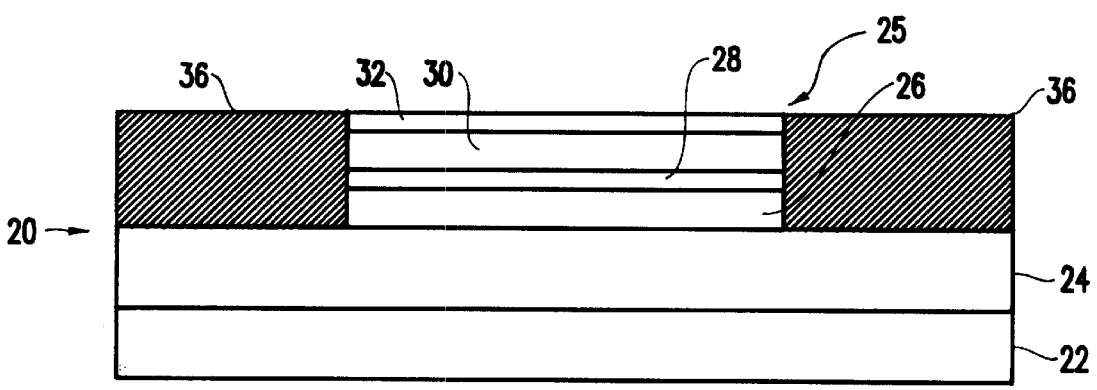

Referring to FIG. 3(b), an oxide or other dielectric layer 36 is deposited onto the backgate mesa 25. Subsequently, a first CMP processing step is used to planarize oxide layer 36 down to the CMP stopping layers 32 as shown in FIG. 3(c). This first CMP processing step isolates the bottom gate 26 and silicon channel 30. It may be necessary to deposit or grow a thin barrier or isolation layer before depositing the thick dielectric 36 to electrically isolate or passivate the backgate 26 and the semiconductor channel 30.

Figure 4A:
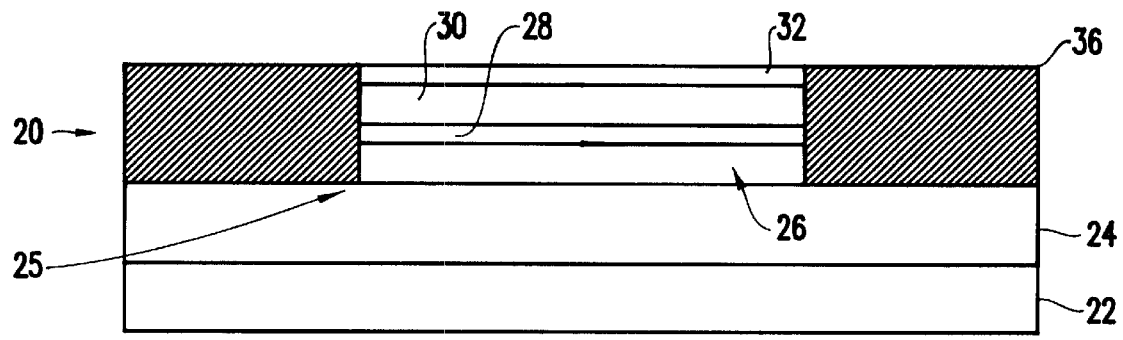
FIGS. 4(*a*)–4(*c*) illustrate various views of the bottom gate mesa from FIG. 3(*c*).
Figure 4B:
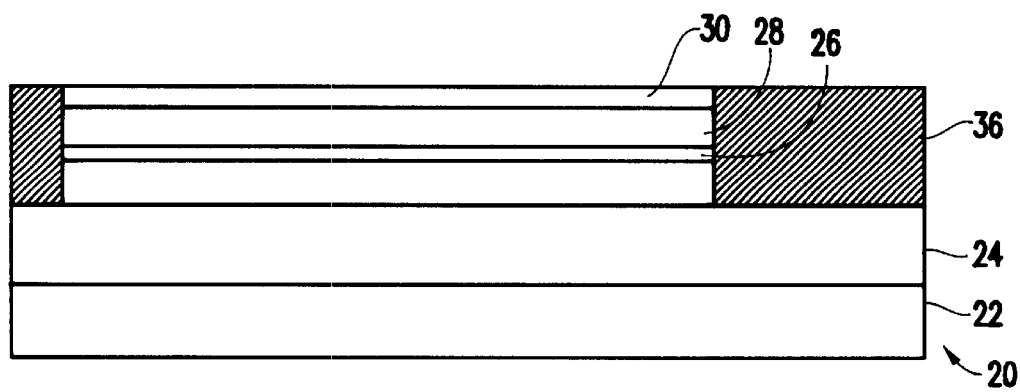
Figure 4C:
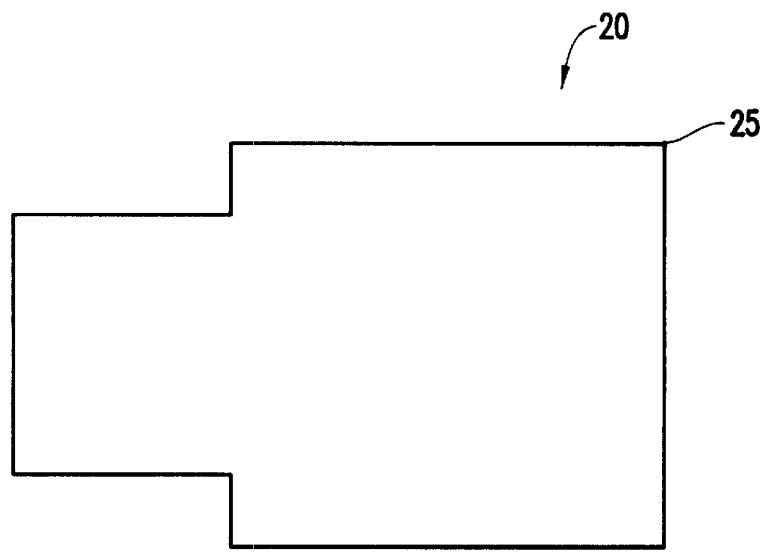

FIGS. 4(a)–4(c) show alternate views of the device 20 following planarization of the oxide layer 36. FIG. 4(c) shows a top down (layout) view of the MOSFET device 20 at the bottom gate mesa isolation step having perpendicular cross sectional lines AB and CD. FIG. 4(a) is a cross section view of the device 20 along line AB and FIG. 4(b) is a cross section view along line CD.

Figure 5A:
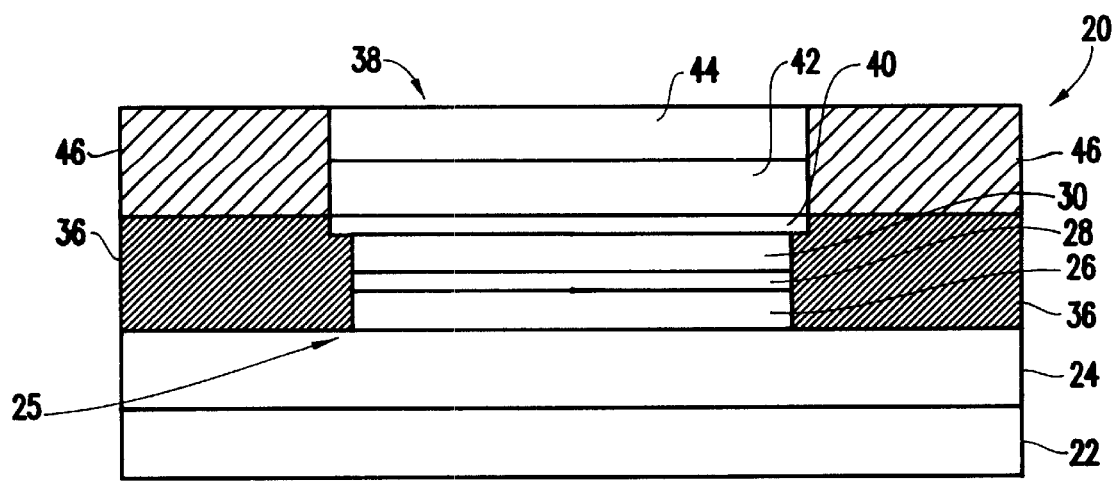
FIGS. 5(*a*)–5(*c*) illustrate various views of a topgate mesa and bottom gate mesa of the device.
Figure 5B:
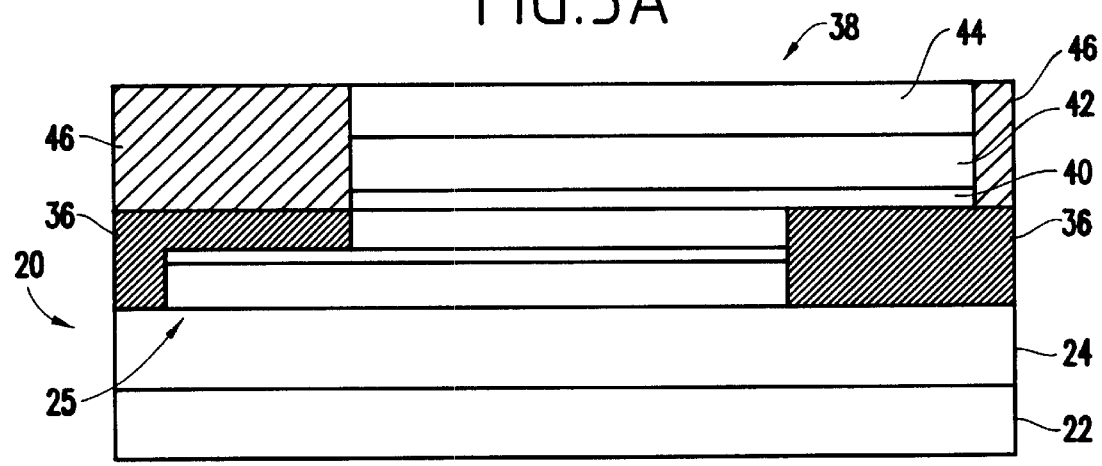
Figure 5C:
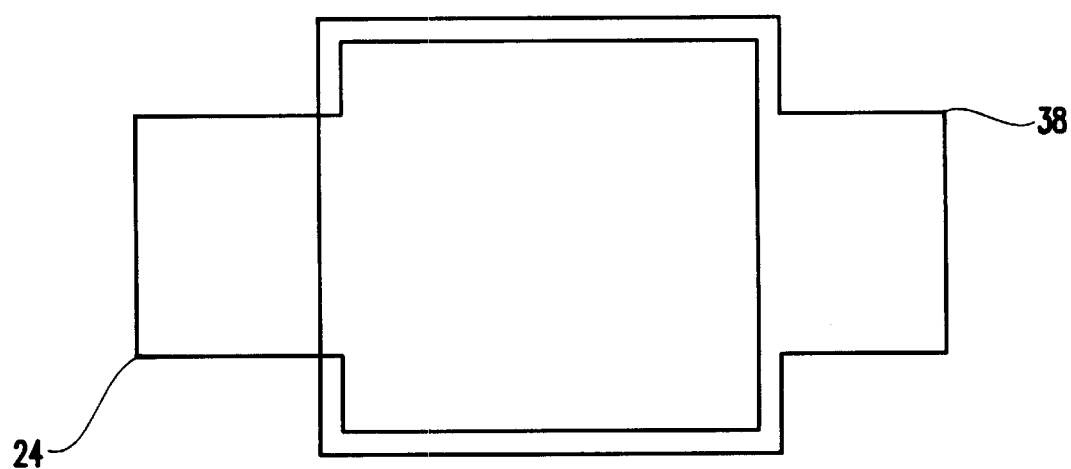

Referring now to FIGS. 5(a)–5(c) along with FIGS. 4(a)–4(c), the topgate mesa 38 is formed on the bottom gate mesa 25. First, the CMP stopping layer 30 (FIG. 4 (a) and (b)) is removed. Subsequently, topgate dielectric 40, topgate conductor 42, and CMP stopping layers 44 are formed (see FIG. 5(a) and 5(b)). CMP stopping layers 44 can act as both CMP stopping and hardmask layers. CMP stopping layers 44 further provide a common reference level for CMP steps used to create isolated source and drain regions (discussed below).

Next, the topgate mesa 38, (i.e. CMP stopping layers 44, topgate material 42, topgate dielectric 40, and silicon channel 30) is etched. A second planarization oxide or other dielectric 46 is deposited and planarized down to the level of the CMP stopping layer 44 (See FIGS. 5 (a) and (b)). Again, thin isolating or passivation layers may need to be grown or deposited before the planarization dielectric 46 is formed.

The first CMP planarization step (i.e. bottom gate isolation) helps eliminate topgate to source/drain shorts, reduces the device 20 topography during subsequent steps, and thereby reduces the necessity for precise overlay between the topgate mesa 38 and bottom gate mesas 25. Without this first CMP planarization step (i.e. bottom gate planarization), the topgate mesa would need to be aligned within 50 nm of the bottom gate mesa edge and etched carefully to avoid a tall ridge of debris around the edge and/or topgate to source/drain shorting. However, with bottom gate planarization, the top and bottom gate mesa overlaps (e.g., along line CD in FIGS. 5(c) can be reduced without topgate to source/drain shorting. The gate overlap capacitances can thus be reduced.

The second planarization step (i.e. planarization of the topgate using CMP) helps eliminate source-to-drain wrap around shorts. The combination of two CMP steps (after bottom gate mesa formation and after topgate formation) is necessary to entirely isolate electrically the source, drain and topgate. The two CMP processing steps also ensure that the device area is flat going into the source/drain well lithography and active topgate etch (discussed below), which will make short device gate lengths and continued device scaling easier to achieve.

Figure 6A:
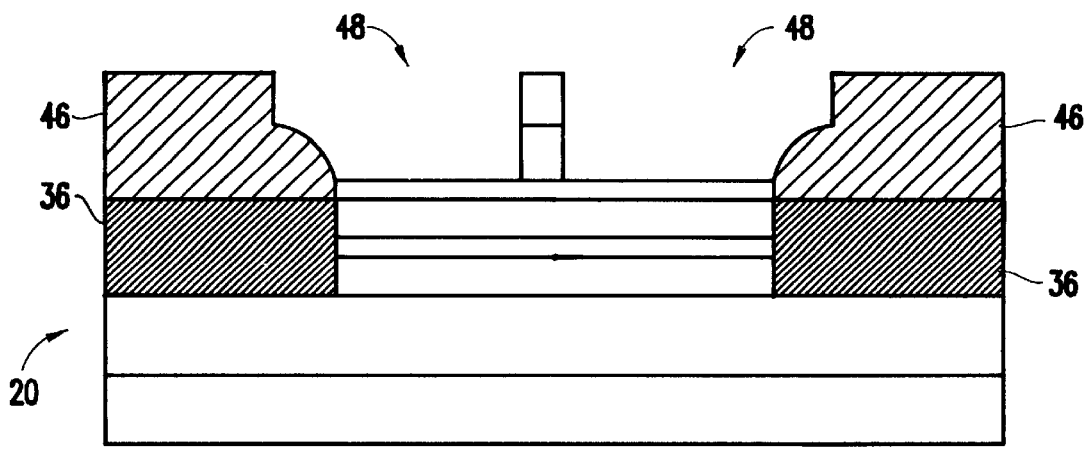
FIGS. 6(*a*)–6(*c*) illustrate various views of a the source/drain well areas formed when the active gate dimension pattern is etched into the topgate mesa.
Figure 6B:
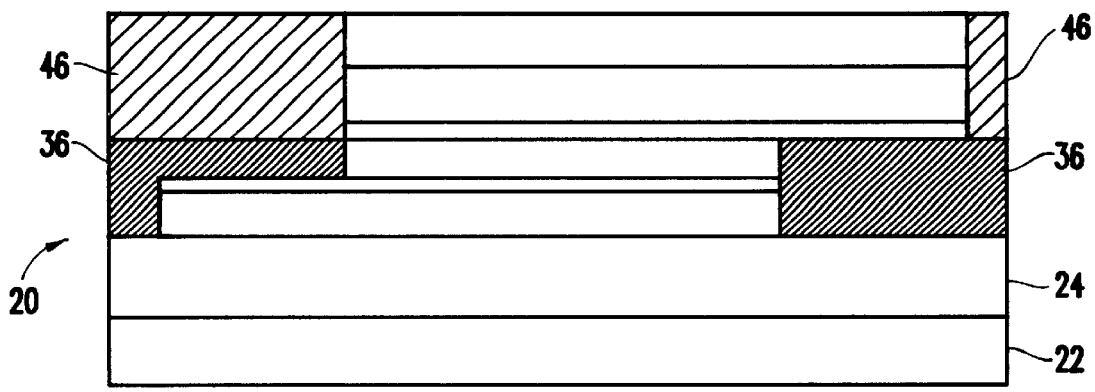
Figure 6C:
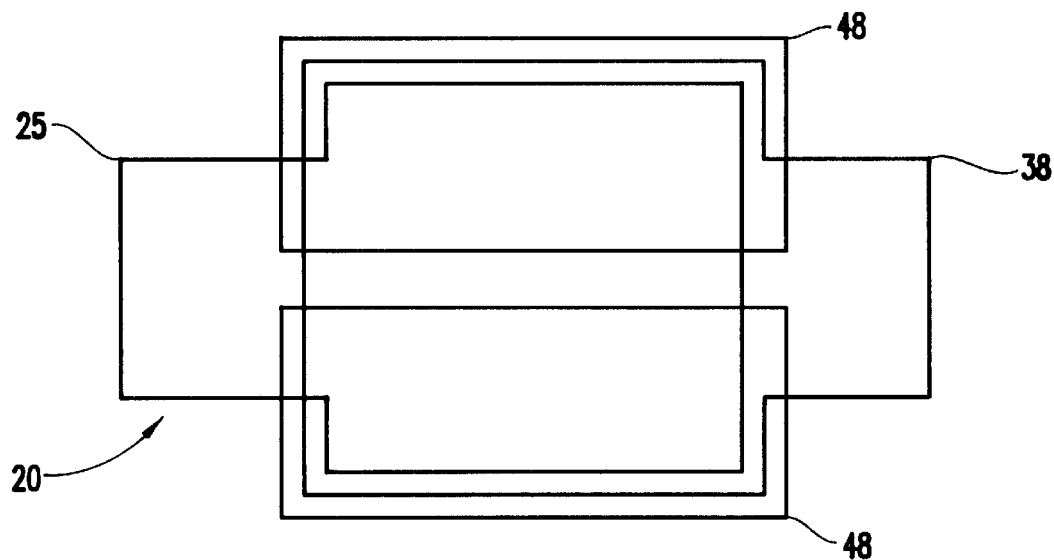
Figure 7A:
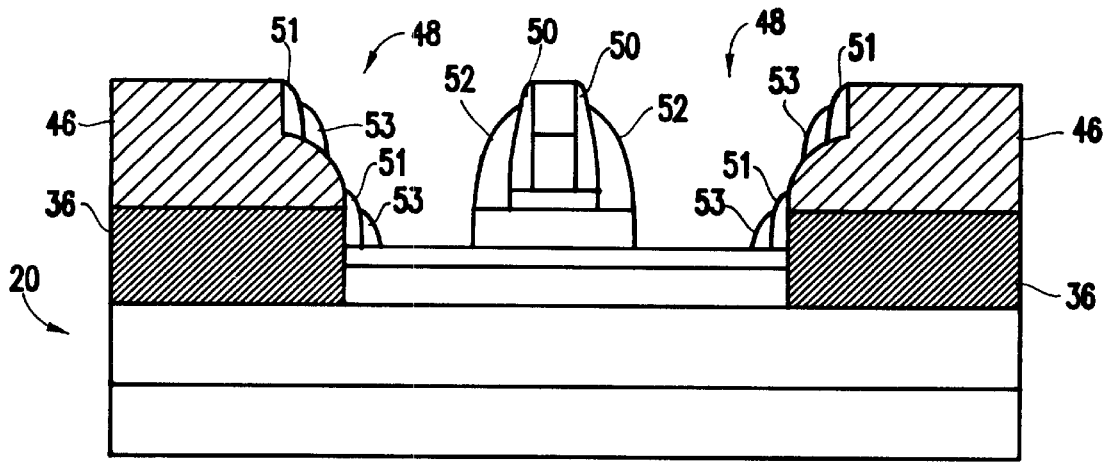
FIGS. 7(*a*)–7(*c*) illustrate a gate insulating spacer (dielectric) and source/drain spacer (doped polysilicon).
Figure 7B:
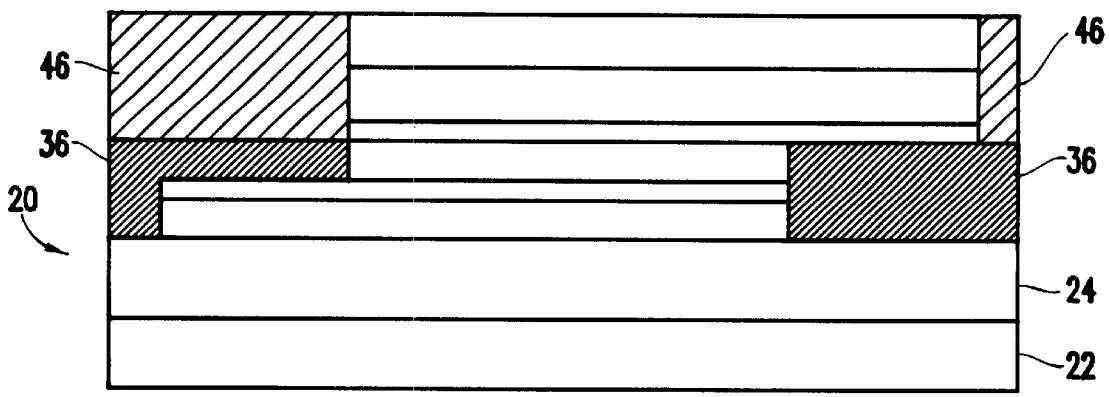
Figure 7C:
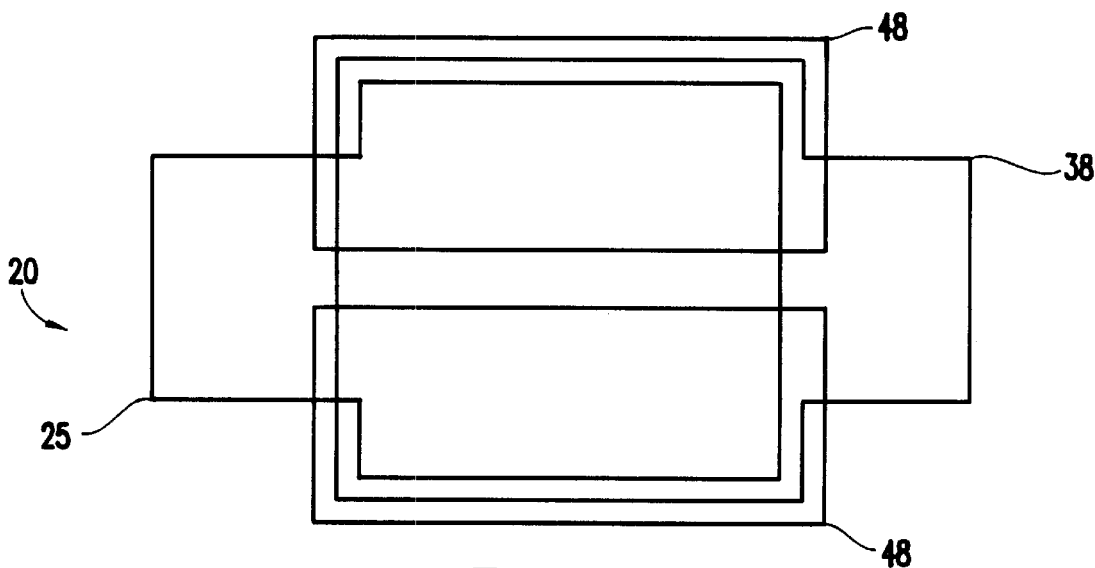

Referring now to FIGS. 6(a)–6(c) and FIGS. 7(a)–7(c), wells 48 are then etched into the topgate mesa 38 using standard lithography and gate etch methods (FIG. 6). Similar to Solomon and Wong, insulating gate spacers 50, 51 and conducting source/drain spacers 52, 53 are deposited and then etched in a self-aligned manner inside the source/drain well areas 48 (FIGS. 7(a)–7(c)). In this step, the etch continues through both the source/drain spacers 52 and the silicon channel 30, stopping on the backgate dielectric 28. Unlike Solomon and Wong, since the field level of the present invention is maintained as a single, flat surface, the conducting sidewalls are entirely contained within the source/drain well areas 48 and there is no risk of electrical shorting to other regions in the present invention.

Figure 8A:
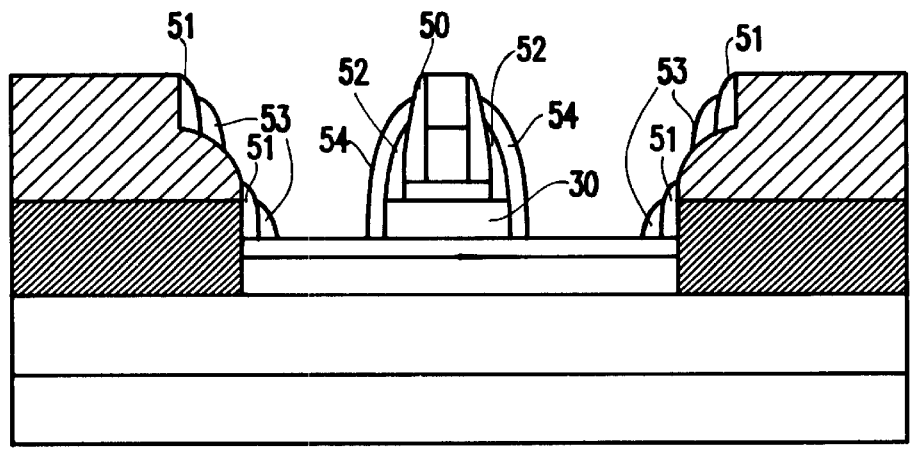
FIGS. 8(*a*)–8(*c*) illustrate gate contact and source/drain silicidation of the device .
Figure 8B:
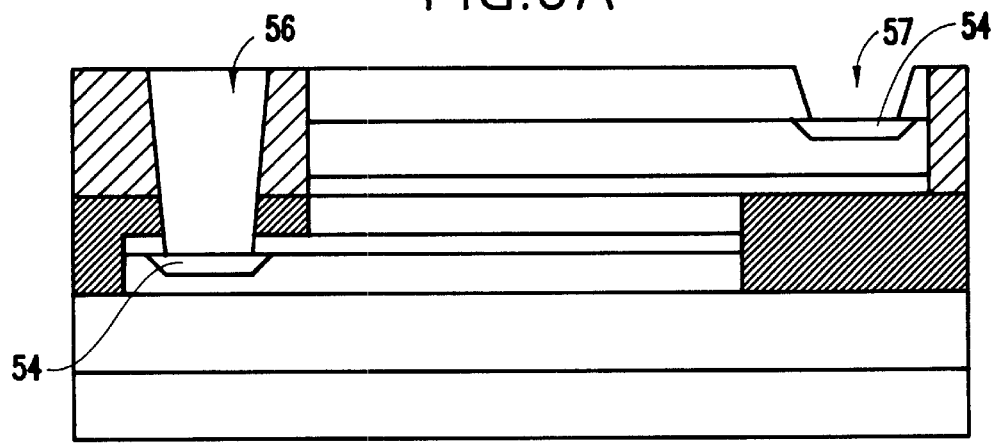
Figure 8C:
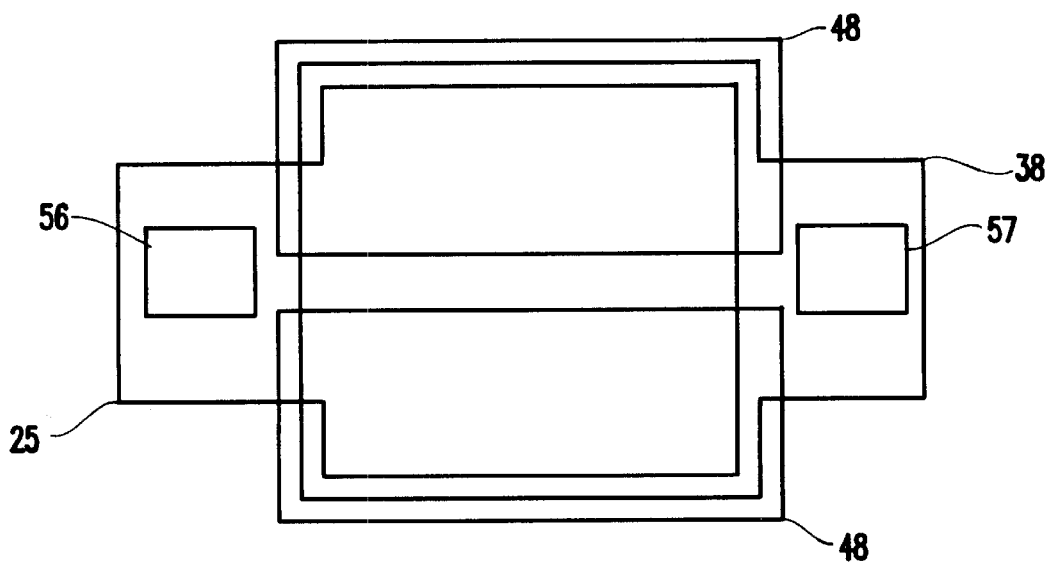

Referring now to FIGS. 8(a)–8(c), after formation and doping of conducting sidewall source/drain spacers 52 from polysilicon (FIG. 7), bottom gate contact hole 56 and topgate contact hole 57 are etched for the top and bottom gates. After contact holes 56, 57 are exposed, self-aligned silicide 54 is grown on the spacer walls 52 and on the edge of the silicon channel 30. This is done by depositing metal such as Co or Ti, depositing a cap layer such as TiN if needed, annealing to form a silicide phase, selectively removing the cap and any residual metal, then annealing to reduce the silicide resistivity, if needed. In the case that the sidewall source/drain 52 and backgate 26 are made of polysilicon, this silicide 54 may be needed to protect the sidewalls 52 and channel 30 while the backgate 26 is etched. In the case that the backgate 26 may be removed selectively, this silicidation may take place after the backgate trimming and isolation, after the steps described in FIG. 9. It also may be desirable to silicide the source/drain sidewalls 52 separately from the top and bottom gates 56, 57. If this is the case, they can remain covered during the backgate trimming and isolation, and the contact hole etch and silicidation 54 in top and bottom gates 56, 57 can be done at a later time, perhaps after the processes described in FIG. 9.

Figure 9A:
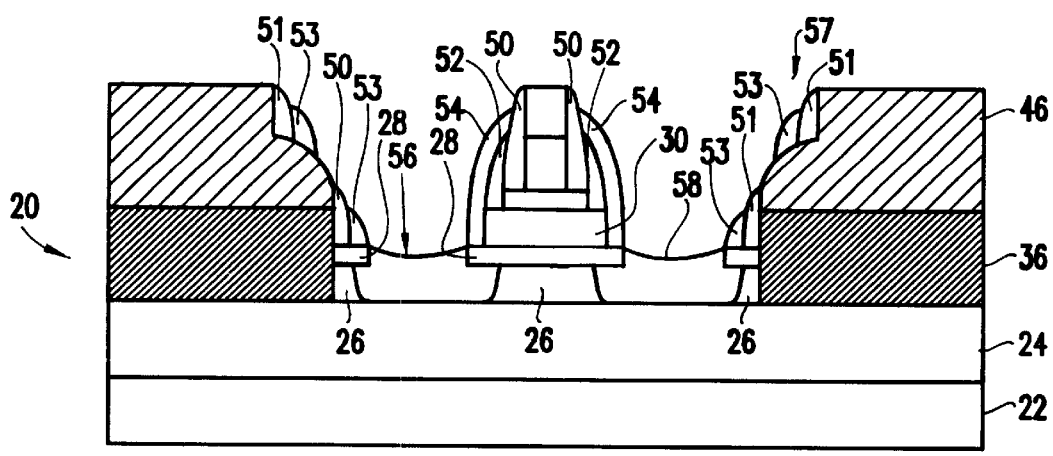
FIGS. 9(*a*)–9(*c*) illustrate backgate under etching and isolation.
Figure 9B:
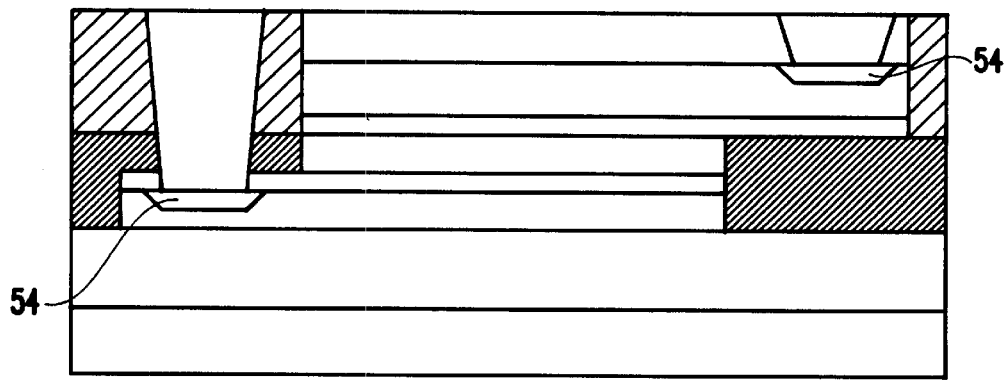
Figure 9C:
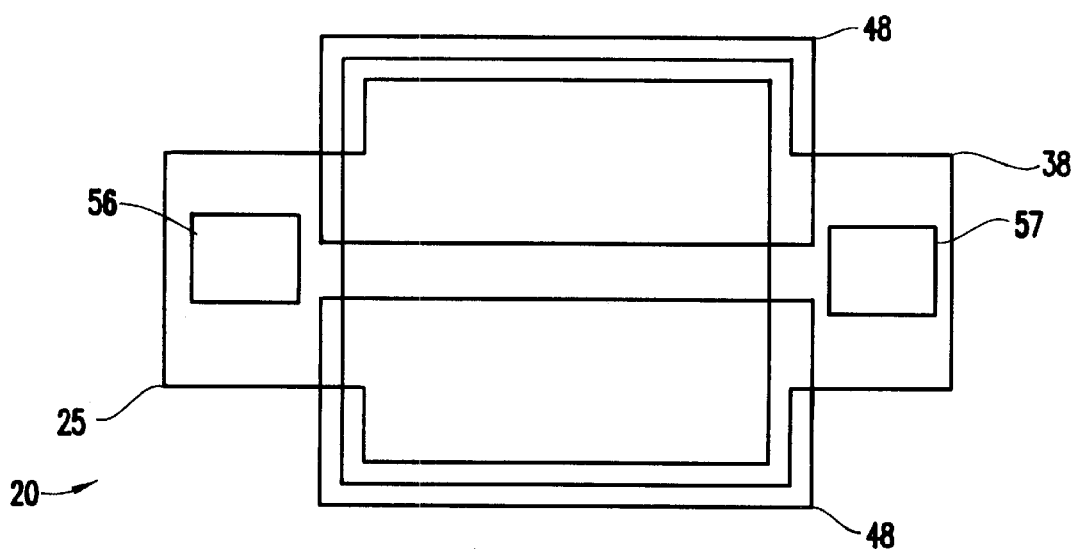

Referring now to FIGS. 9(a)–9(c), the backgate material 26 is etched and underetched to recess it under the silicon channel 30. The preferred process shown in the figure is to perform the backgate 26 recess etch after forming the source/drain silicide 54. First, the backgate dielectric 28 must be removed selectively, and then the backgate material 26 may be wet etched or isotropically dry etched until it is trimmed to the approximate size of the topgate 42. Alternatively, rather than etching and underetching the backgate material 26 after formation of polysilicon source/drain silicided gate contacts 54, this etching and underetching step could come directly after the topgate etch. Both are ways of using the topgate 42 as a mask for patterning the backgate 26. Careful alignment of the position and size of the top and bottom gates is essential for low overlap capacitance and high speed of MOSFET devices.

Figure 10A:
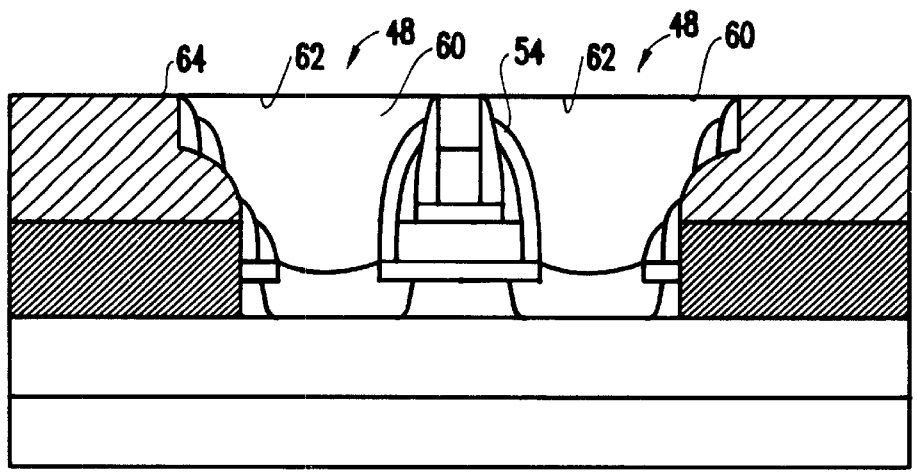
FIGS. 10(*a*)–10(*c*) illustrate a plug planarization of one embodiment of the present invention.
Figure 10B:
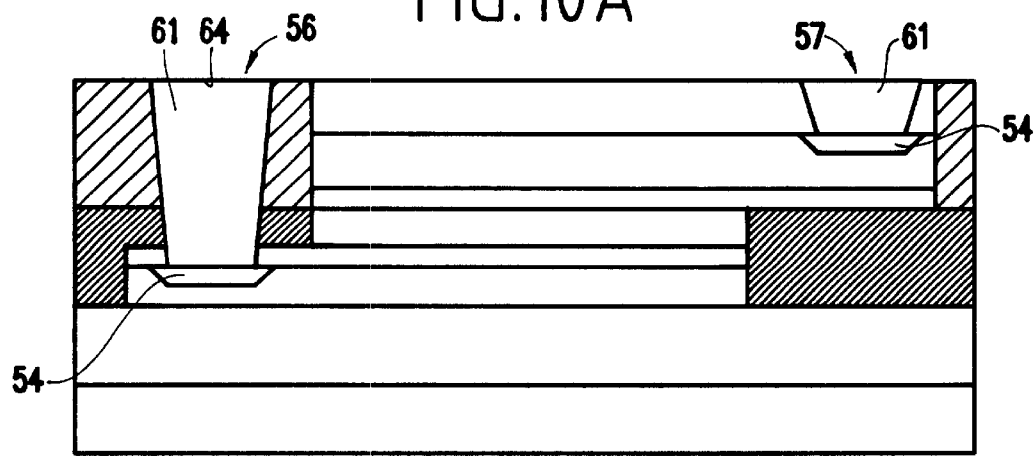
Figure 10C:
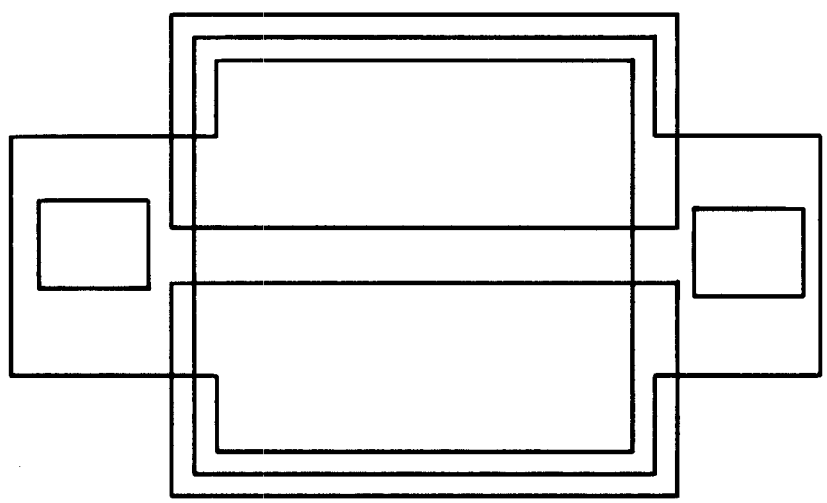

Referring now to FIG. 10 (a), the wafer surface is planar, with the exception of the source/drain well areas 48 and bottom gate and topgate contact holes 56, 57. The source/drain wells 48 may be filled using a metal damascene process, perhaps tungsten. In this process, the well plug metal 60 is deposited into the source/drain wells 48. The well plug 60 is formed here by depositing a W layer 62. Subsequently, the W layer is planarized using CMP. The well might alternatively be filled with metal, perhaps Cu or a copper alloy, by electroplating, as long as the correct liners are used to prevent diffusion of the copper into the active device. The fill metals 61 and 62 might also include, in addition to the metal or metal alloy that fills most of the wells, thin layers used as liners to prevent oxidation, diffusion or electromigration of the fill metal, or thin layers used to promote adhesion of the metals to the device. The fill metals 61 and 62 form either a metal layer or multilayer metal stack depending on the composition of the fill metal and the process used.

In addition, prior to CMP processing of the well plug 60, the bottom gate contact hole 56 and topgate contact hole 57 may be filled with tungsten fill metal 61 (FIG. 10 (b)). Filling bottom gate contact hole 56 and topgate contact hole 57 provides for a planar wafer surface having planar field area 64 following planarization of the W layer using CMP. One advantage, of this embodiment of the present invention is the production of a wafer surface with a planar field area 64 which Solomon and Wong fails to produce.

Figure 11A:
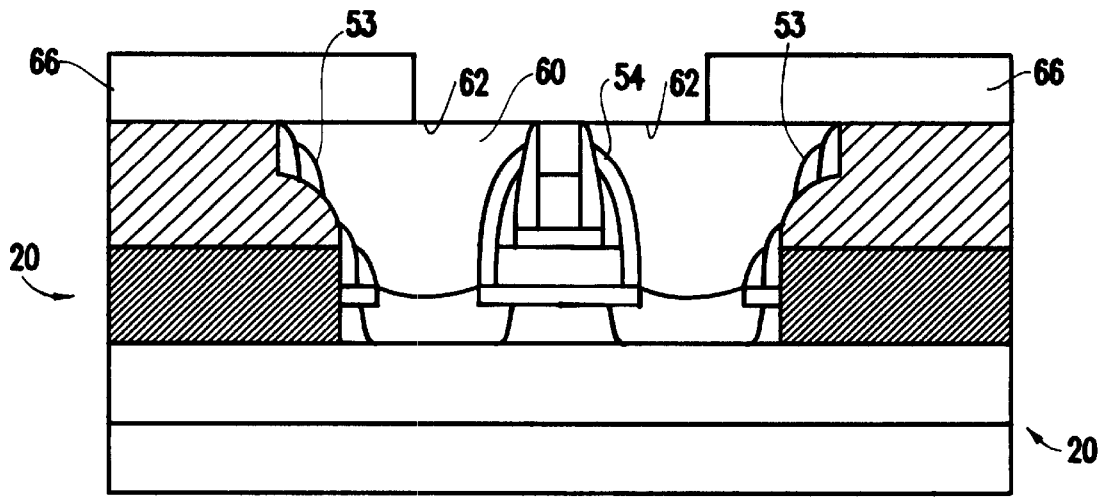
FIGS. 11(*a*)–11(*c*) illustrate metallization of the device according to the present invention.
Figure 11B:
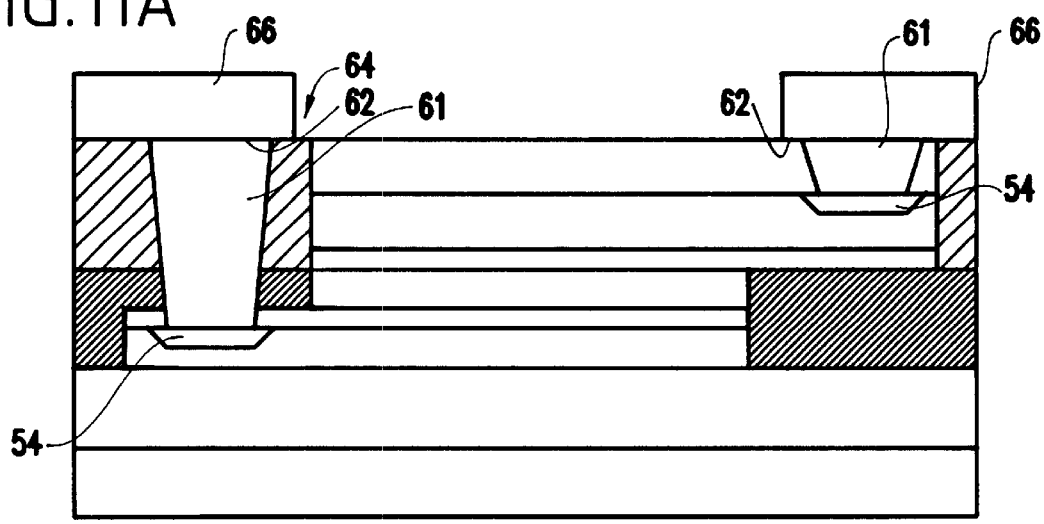
Figure 11C:
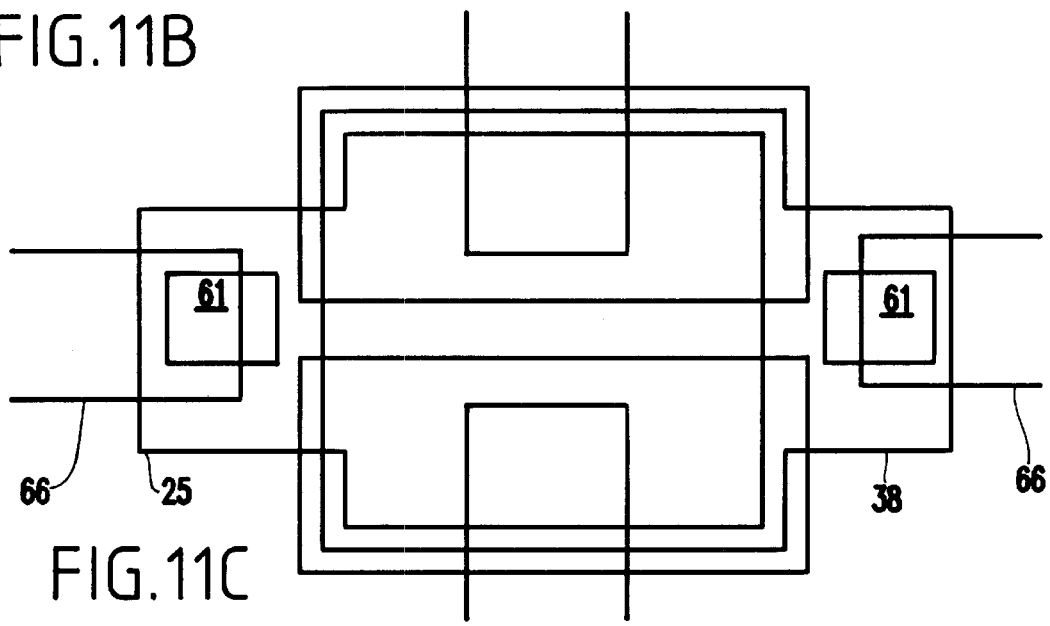

Referring to FIGS. 11(a)–(c), metal 66 is deposited on backgate 20. Metal 66 contacts well plug 60 and does not make contact with the silicided sidewalls 52. This first level of metal 66 may be any standard interconnect metal, perhaps Al, Cu or other low resistance metallic alloys. The CMP plug processing produces a planar field area 64. The space between the metal lines used to interconnect the devices can thus be increased compared to the device of Solomon and Wong, and of course, in this new inventive process, the lines are being patterned on a flat surface instead of over topography.

In addition to the topgate masking pattern illustrated in FIGS. 3–11 and described above, alternative methods may be used. FIGS. 3–11 illustrate a timed isotropic wet or dry recess etch of the backgate material. In addition, it may also be possible to use the topgate as a mask for selective modification of the backgate material. This would make it possible to remove backgate material selectively, which would make the size alignment more precise and controllable.

A high dose implantation or ion beam modification of the backgate could be used after the topgate etch or after the gate dielectric spacer (e.g. gate dielectric spacer 50 of FIG. 5(a)) to modify the properties of the backgate conductor in the area that needs to be removed. For example, if the backgate material were p-type silicon, it would be possible to implant n-type dopants into the area around the active gate, as after an anneal, the n-type polysilicon could be removed selectively with respect to p-type polysilicon by KOH etchant. Another embodiment might use metal implantation and annealing to turn unwanted area around a polysilicon gate into a silicide which can be removed selectively with respect to silicon.

Other important variations are ways of improving the isolation afforded by the planarization of the bottom gate mesa 25 (FIGS. 4(a)–4(c)). While FIGS. 4(a)–4(c) depict a single dielectric layer 36 being deposited and planarized for this isolation, better isolation may be realized by putting down one or more thin liner layers of other materials before dielectric layer 36. A thin layer of nitride, for example under dielectric layer 36, would provide better isolation in a process where the wafer is exposed to a large number of hydrofluoric acid cleans that might erode the planarization dielectric layer 36.

The advantages of this process are ways to make double gate devices from silicon substrates prepared with blanket layers of materials: since we use the topgate as a mask to etch the bottom gate, their self alignment can be quite good. This device is an improvement over Solomon and Wong as it provides better device isolation and topography, leading to improved manufacturability while maintaining all the advantages of the previous device.

While the invention has been described in terms of preferred embodiments, those skilled in the art will recognize that the invention can be practiced with modification within the spirit and scope of the appended claims.

What is claimed is:

1. A method of forming a double gate metal-oxide-semiconductor field effect transistor (MOSFET), comprising:
   planarizing a bottom mesa stack using chemical mechanical polishing (CMP) to isolate a bottom gate mesa;
   forming a topgate mesa stack;
   patterning a topgate mesa;
   trimming a backgate using a topgate as a mask to transfer a topgate pattern to the backgate; and
   isolating the trimmed backgate.

2. The method of claim 1 wherein trimming the backgate using the topgate comprises using an isolated topgate.

3. The method of claim 1 wherein said trimming further comprises using an isolated topgate plus source/drain sidewall spacers.

4. The method of claim 1 wherein said planarizing comprises depositing a dielectric layer to the bottom mesa stack prior to chemical mechanical polishing (CMP).

5. The method of claim 4 wherein said planarizing further comprises depositing at least one layer of a material different from the dielectric layer prior to depositing the dielectric layer.

6. The method of claim 1 further comprising:
   filling a source/drain well area to form one of a metal layer and a multilayer metal stack; and
   planarizing said one of said metal layer and said multilayer metal stack using chemical mechanical polishing (CMP).

7. The method of claim 1 wherein said trimming comprises one of implanting and introducing any impurity dopant into the backgate material in an area around an active device and applying an etchant to selectively remove the modified silicon.

8. The method of claim 7 wherein said trimming further comprises performing thermal treatment on the active device before removing a modified silicon with an etchant.

9. The method of claim 1 wherein said trimming comprises:
   implanting metal into an area around an active portion of the backgate;
   annealing the metal to turn an unwanted area around the backgate into a silicide; and
   removing the silicide selectively from the backgate.

10. The method of claim 1 wherein said forming further comprises planarizing the topgate using a second chemical mechanical polishing (CMP) process to isolate the topgate mesa.

11. The method of claim 1 wherein said trimming comprises matching in dimension and position the backgate to the topgate.

12. A method of forming a backgate for a double gate metal-oxide-semiconductor field effect transistor (MOSFET), comprising:

supplying a bottom gate mesa stack;

planarizing the bottom gate mesa stack using chemical mechanical polishing (CMP) to isolate a bottom gate mesa;

forming a topgate mesa stack;

patterning the topgate mesa;

trimming a backgate using a topgate as a mask to transfer a pattern to the backgate; and isolating the trimmed backgate.

13. The method of claim 12 wherein said trimming comprises using an isolated topgate.

14. The method of claim 12 wherein said trimming further comprises using an isolated topgate plus source/drain sidewall spacers.

15. The method of claim 12 wherein said planarizing comprises depositing a dielectric layer onto the bottom gate mesa stack prior to chemical mechanical polishing (CMP).

16. The method of claim 15 wherein said planarizing further comprises depositing at least one layer of a material different from the dielectric layer prior to depositing the dielectric layer.

17. The method of claim 12 further comprising:

filling a source/drain well area to form one of a metal layer and a multilayer metal stack; and planarizing said one of said metal layer and said multilayer metal stack using chemical mechanical polishing (CMP).

18. The method of claim 12 wherein said trimming comprises one of implanting and introducing any impurity dopant into a backgate material in an area around an active device and applying an etchant to selectively remove a modified silicon.

19. The method of claim 18 wherein said trimming further comprises performing thermal treatment on the active device before removing the modified silicon with an etchant.

20. The method of claim 12 wherein said trimming comprises:

implanting a metal into an area around an active portion of the backgate;

annealing the metal to turn an unwanted area around the backgate into a silicide; and removing the silicide selectively from the backgate.

21. The method of claim 12 wherein said forming further comprises planarizing the topgate using a second chemical mechanical polishing (CMP) process to isolate the topgate mesa.

22. The method of claim 12 wherein said trimming comprises matching in dimension and position the bottom gate mesa to the topgate.

* * * * *